United States Patent
Soref et al.

(10) Patent No.: US 7,391,801 B1
(45) Date of Patent: Jun. 24, 2008

(54) ELECTRICALLY PUMPED GROUP IV SEMICONDUCTOR MICRO-RING LASER

(75) Inventors: Richard A. Soref, Newton, MA (US); Stephen J. Emelett, Lansing, NY (US)

(73) Assignee: The United States of America as represented by the Secretary of the Air Force, Washington, DC (US)

(*) Notice: Subject to any disclaimer, the term of this patent is extended or adjusted under 35 U.S.C. 154(b) by 417 days.

(21) Appl. No.: 11/286,010

(22) Filed: Nov. 25, 2005

(51) Int. Cl.
*H01S 3/08* (2006.01)
*H01S 5/00* (2006.01)

(52) U.S. Cl. .................. 372/92; 372/43.01; 372/45.01; 372/46.01; 372/108

(58) Field of Classification Search ............ 372/43.01, 372/45.01, 46.01, 92, 98
See application file for complete search history.

(56) References Cited

U.S. PATENT DOCUMENTS

| | | | | |
|---|---|---|---|---|
| 5,878,070 | A * | 3/1999 | Ho et al. ................ | 372/92 |
| 5,955,749 | A * | 9/1999 | Joannopoulos et al. ....... | 257/98 |
| 6,468,823 | B1 * | 10/2002 | Scherer et al. ............. | 438/31 |
| 6,541,295 | B1 * | 4/2003 | Looney ................... | 438/29 |
| 6,674,778 | B1 * | 1/2004 | Lin et al. ............... | 372/46.01 |
| 6,711,200 | B1 * | 3/2004 | Scherer et al. ............. | 372/64 |
| 6,839,488 | B2 * | 1/2005 | Gunn, III ................ | 385/40 |
| 2004/0222411 | A1 * | 11/2004 | Atanackovic et al. ........ | 257/34 |
| 2004/0252931 | A1 * | 12/2004 | Belleville et al. ........... | 385/14 |
| 2006/0050744 | A1 * | 3/2006 | Wong et al. ............... | 372/3 |

OTHER PUBLICATIONS

A Model Calculation on Optical Gain and Co-Stimulated Emissions of Photons and Phonons in Silicon, by M. J. Chen and C. S. Tsai P2 p. 57-59, Sep. 21-23, 2005.
Nonlithographic Fabrication of Lateral Superlattices for Nanometric Electromagnetic-Optice Applications by Liang et al, IEEE J. of Selected Topics in Quantum Electronics, vol. 8, pp. 998-1008, Sep./Oct. 2002.
Laser-like emission from a periodic all-silicon nanostructure, by S.G. Cloutier and J. M. Xu submitted for publication 2005.
Add-drop filters utilizing vertically coupled microdisk resonators in silicon, by P. Koonath, T. Indukuri and B. Jalali, 2005.

(Continued)

*Primary Examiner*—Minsun Harvey
*Assistant Examiner*—Phillip Nguyen
(74) *Attorney, Agent, or Firm*—AFMCLO/Jaz; Robert V. Klauzinski

(57) ABSTRACT

An electrically pumped semiconductor laser is provided as including a waveguide structure disposed on the substrate. An optical coupling layer is disposed on the substrate and the waveguide. A resonator layer is disposed on the optical coupling layer and may be adapted to include a photonic crystal lattice having a plurality of substantially cylindrical pores extending downwardly into the resonator layer. An insulating cap layer may be disposed on the resonator layer which operatives to seal the photonic crystal lattice. A first plug filled vias is formed on a central region of the cap layer, which extends downwardly to permit a bottom portion of the first plug to communicate with the photonic crystal lattice. Further, a second plug filled vias is formed on an edge region of the cap layer and extends downwardly to permit a bottom portion of the second plug to communicate with the photonic crystal lattice.

22 Claims, 3 Drawing Sheets

OTHER PUBLICATIONS

Micrometre-scale silicon electro-optic modulator, by Q. Xu, B. Schmidt, S. Pradhan and M. Lipson, Nature vol. 453, No. 19, pp. 325-327, May 19, 2005.

Stimulated emission in a nanostructured silicon *pn* junction diode using current injection, by M.J. Chen, J.L. Yen, J. Y. Li, J.F. Chang, S.C. Tsai, and C.S. Tsai, vol. 84 No. 12 pp. 2163-2165, Mar. 22, 2004.

Fabrication of vertically-coupled silicon nanophotonic circuits via SIMOX 3-D sculpting, by B. Jalali, P. Koonath, and T. Indukuri, Optoelectronic Ingregrated Circuits VII vol. 5729, Jan. 2005.

Design considerations for devices based upon small SOI waveguides, by G.T. Reed et al, paper FC5, pp. 198-200.

Vertically Integrated Silicon-on-Insulator Waveguides by R.A. Soref, F. Namavar and E. Cortesi, IEEE Photonics Technology Letters, vol. 3, No. 1, Jan. 1991.

Method for Fabricating Low Loss Crystalline Silicon Waveguides by Dielectric Implantation, by J.P. Lorenzo and R. Soref, Dec. 6, 1988.

Relaxed Silicon-germanium-on-insulator fabricated by oxygen implantation and oxidation-enhanced annealing, by Z. Chen, F. Zhang, J. Chen, B. Jin, Y. Wang, C. Zhang, Z. Zhang, and X. Wang, Semiconductor Science and Technology, UK, vol. 20 pp. 770-774 (2005).

35 GHz bandwidth Germanium-on-silicon photodetector by M. Rouviere, L. Vivien, X. Le Roux, J. Mangeney, P. Crozat, C. Hoarau, E. Cassan, D. Pascal and S. Laval, pp. 174-176.

\* cited by examiner

ELECTRICALLY PUMPED GROUP IV SEMICONDUCTOR MICRO-RING LASER

STATEMENT OF GOVERNMENT INTEREST

The invention described herein may be manufactured and used by or for the Government for governmental purposes without the payment of any royalty thereon.

FIELD OF THE INVENTION

The present invention relates generally to Group IV semiconductor devices and, more particularly, to an electrically pumped silicon-based semiconductor micro-ring laser.

BACKGROUND OF THE INVENTION

As is known, the semiconductor industry has been trying to develop semiconductor lasers using conventional silicon and/or other Group IV semiconductor manufacturing processes. There has also been significant interest in developing the so-called system on a chip (e.g., SOC), which may include analog and digital circuitry, as well as optical networks, which may all contained in a single package on a single silicon chip. In order to realize an active optical-network-on-a-chip, it has become necessary to provide ultracompact silicon lasers. To make SOCs and other optical semiconductor devices truly practical, it is desirable to have room temperature operation as well as electrical pumping of the silicon laser diodes, which are necessarily contained on the SOCs and/or other optical semiconductor devices.

The search for electrically pumped silicon-based lasers that emit light near 1.3 and 1.55 µm telecomm wavelengths has been underway for years, with a diversity of approaches tried including doping silicon with Erbium ions, or using silicon nano-crystals; however, these as well as other approaches have not provided definitive lasing. The approach closest to success has been the forward-biased silicon PN-junction rib-waveguide device of M. J. Chen et al ("Stimulated emission in a nano-structured silicon pn junction diode using current injection," Applied Physics Letters, vol. 84, pp. 2163-2166, 22 Mar. 2004). This device exhibited stimulated emission at 1.21 µm, however, no resonator was present, the vertical confinement of light was weak, and the ridge was wide.

It would, therefore, be desirable to overcome the aforesaid and other disadvantages.

SUMMARY OF THE INVENTION

An electrically pumped semiconductor laser is set forth. The electrically pumped semiconductor laser includes a strip waveguide structure disposed on a silicon substrate. An optical coupling layer may be disposed on the substrate and the strip waveguide structure, which is followed by the disposal of a resonator layer on the optical coupling layer. The resonator layer may include a lateral superlattice having a plurality of substantially cylindrical pores extending downwardly into the resonator layer. An insulating cap layer may be disposed on the resonator layer, which is operative to seal the superlattice.

The laser may further include a first plug-filled via formed on a central region of the cap layer. The first plug-filled via extends downwardly to permit a bottom portion of the first plug to communicate with a first impurity-doped unguided wing region of the superlattice. A second plug filled via may be formed on an edge region of the cap layer. The second plug-filled via may extend downwardly to permit a bottom portion of the second plug to communicate with a second impurity-doped unguided wing region of the superlattice. In this arrangement, electrical current conducted between the first and second plug-filled vias is operative to excite predetermined elements of the superlattice defined on the resonator layer for generating light in the resonator layer, which light is redirected to the waveguide structure, via the optical coupling layer.

BRIEF DESCRIPTION OF THE DRAWINGS

The invention will be more fully understood from the following detailed description taken in conjunction with the accompanying drawings, in which.

DETAILED DESCRIPTION OF THE INVENTION

The present invention provides an electrically pumped silicon-based semiconductor micro-ring laser. The electrically pumped semiconductor micro-ring laser is constructed and arranged to provide a light beam at an optical output of the laser having a wavelength ranging from approximately 1200 nm to approximately 2000 nm, which is particularly useful in telecommunication applications, optical interconnects, optical signaling and/or a number of other computing or signaling applications.

Figure 1:
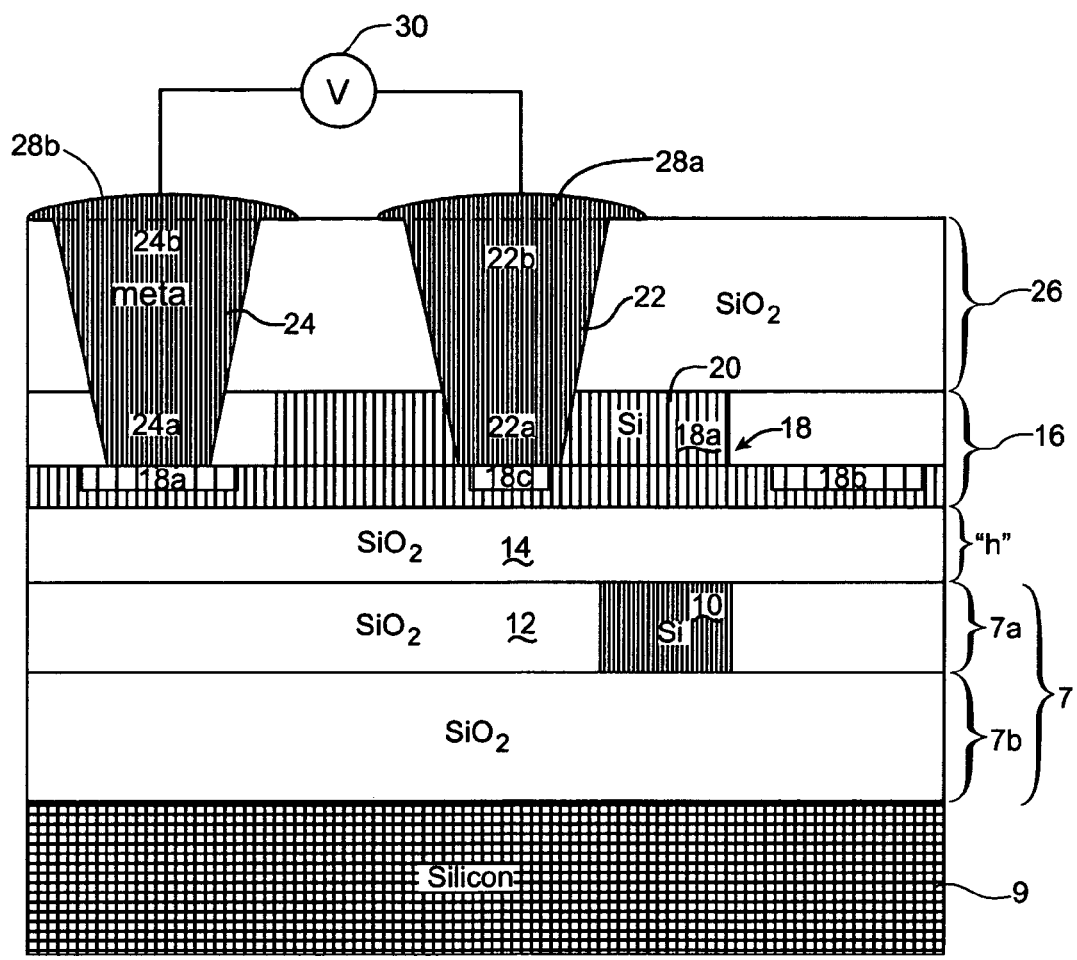
FIG. 1 shows a cross-sectional view of an embodiment of the electrically pumped semiconductor micro-ring laser in accordance with the present invention.

Referring now to FIG. 1, shown is a cross-sectional view of one embodiment of the electrically pumped semiconductor micro-ring laser 5 in accordance with principles of the present invention. In the illustrative embodiment, the electrically pumped semiconductor micro-ring laser 5 includes a substrate 7, which in the exemplary embodiment may include a silicon-on-insulator (SOI) wafer having a top layer 7a formed of crystal silicon and a bottom buried layer 7b formed of an insulating or dielectric material, such as oxide or silicon dioxide. Typically, the silicon substrate 9 is integral to SOI and offers a sturdy and rigid support.

The silicon layer 7a of the SOI wafer 7 can be selectively etched using and one of number of well known photolithographic semiconductor wafer process for selectively removing portions of the silicon for forming an elongated strip or rib bus waveguide 10 (e.g., light pipe), which will be described in further detail below. After forming the bus waveguide 10, an insulating or filler layer 12 of silicon dioxide may be disposed on adjacent sides of the bus waveguide 10 for providing a substantially planar surface to uniformly support disposal of subsequent layers. The insulator filler layer 12 is adapted to provide a relatively strong lateral confinement of light in the bus waveguide for providing a high-index-contrast waveguide that can have tight-radius bends, as desired, in regions away from the ring.

An optical coupling layer 14 is disposed on the filler layer 12 and the bus waveguide 10, which in the exemplary embodiment may include silicon dioxide. In the exemplary embodiment, the optical coupling layer 14 may include an optically conductive material or composition of materials, typically glassy silicon dioxide, or silicon oxynitride. The thickness or height "h" of the optical coupling layer 14 should be carefully controlled to provide a predetermined optical coupling between the bus waveguide 10 and a resonator layer 16, as will be described further below.

The resonator layer 16 is disposed on the optical coupling layer 14 and includes a very-short-period lateral superlattice 18 having a plurality of substantially cylindrical pores 20 extending downwardly into the resonator layer 16 penetrating that layer completely. As shown, the superlattice 18 defined on the resonator 16 includes a ridge portion 18a and a wing portion 18b. The rib or ridge waveguide portion 18a of the superlattice 18 includes a central disk-shaped p-type doped semiconductor material region 18c which may be disposed to be in substantial alignment with a bottom portion 22a of a first conductive plug filled via 22. Similarly, the wing portion 18 of the semiconductor superlattice 18 includes an annual ring-shaped n-type doped semiconductor material region, surrounding the intrinsic (I-type) ridge. The n-region 18d, as depicted in the cross-sectional view of FIG. 1, may be disposed to be in substantial alignment with the bottom portion 24a of a second conductive plug filled via 24. It should be understood that the p and n doped regions 18c, 18d may be reversed. Further, the superlattice pores 20 may be made to extend into the doped regions 18c, 18d.

An insulating cap layer 26 may be disposed on the resonator layer 16 which serves to seal the ring resonator and doped injector regions 18. As generally mentioned above, the first conductive plug filled hole or "via" 22 may be formed on a central region of the cap layer 26 and may extend downwardly through a portion of the resonator layer 16 to permit the bottom portion 22a of the first conductive plug filled via 22 to electrically communicate with the p-region 18c. Similarly and as also generally mentioned above, the second conductive plug filled "via" 24 may be formed on an adjacent region of the cap layer 26 and may also extend downwardly through a portion of the resonator layer 16 to permit the bottom portion 24a of the second conductive plug 24 to electrically communicate with the annual n-region 18 d. In addition, first and second contact electrodes 28a, 28b may be respectively disposed on the top surfaces 22b, 24b of the respective first and second conductive plug filled vias 22, 24 to provide an electrical interface to a power source 30 for electrically pumping or driving the laser 5 of the present invention.

Figure 2:
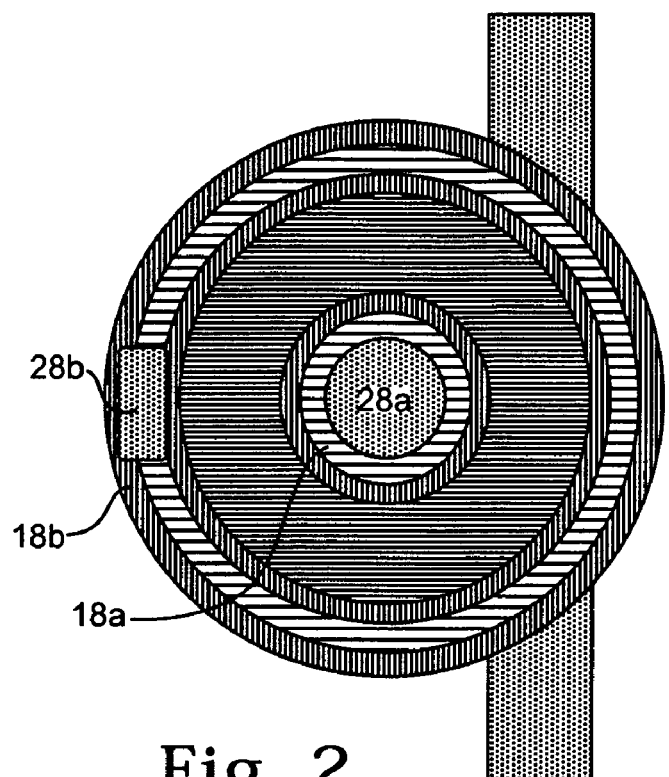
FIG. 2 shows a top view of the electrically pumped semiconductor micro-ring laser of FIG. 1.
Figure 3:
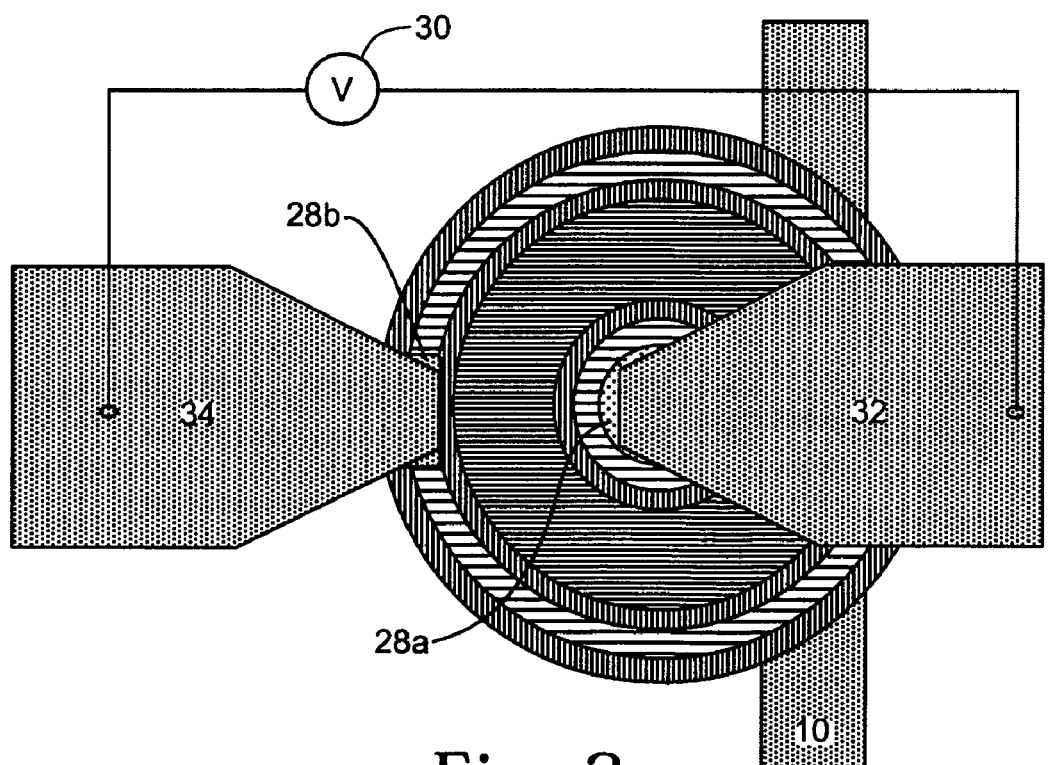
FIG. 3 shows a power source coupled to the electrically pumped semiconductor micro-ring laser of FIG. 1 via first and second signal traces.

Referring to FIG. 2, shown is a top view of the electrically pumped semiconductor micro-ring laser 5, as illustrated of FIG. 1. In FIG. 2, pores associated with the photonic crystal lattice are formed in the p-type and n-type semiconductor material doped regions 18c, 18d (FIG. 1), as well as on the ridge and wings portions 18a, 18b of the laser 5. FIG. 2 further shows a top view of the first and second contact electrodes 28a, 28b, which are formed on respective first and second conductive plug filled vias 22, 24 (FIG. 1) for providing an electrical interface to the laser 5. FIG. 2 also shows a top view of the vertically coupled bus waveguide 10 that transports the output light from the ring laser 5 and allows that light to be transmitted to other photonic components on the chip (not shown) by means of monolithic interconnection to those components. In one example, the first and second conductive plugs 22, 24 may have lateral dimensions ranging from approximately 100 nm to approximately 200 nm. The first and second contact electrodes 28a, 28b respectively disposed on the first and second conductive plugs 22, 24 may include suitably larger dimensions to permit practical interconnections to respective first and second signal traces or "contact pads" 32, 34, as shown in FIG. 3. The first and second "macroscopic" pads 32, 34 are employed to interconnect the respective first and second contact electrodes 28a, 28b to a power source 30. The laser 5 of the present invention provides a relatively low power output, for example, 50 microwatts (cw or internally modulated), which can be amplified to milliwatt levels using a straight, waveguided optical amplifier (not shown), essentially an inline non-resonated version of the present PIN superlattice.

The following provides materials, structures and operational theories for numerous variations of the electrically pumped semiconductor micro-ring laser 5 of the present invention. In one embodiment, the electrically pumped PIN-diode semiconductor micro-ring laser 5 is provided as having an electrically injected resonator 16 made out of crystalline or dense nanocrystalline group IV material: an alloy or elemental semiconductor material, such as SiGe or Si or Ge. The laser's 5 photon energy may be slightly less than the indirect bandgap energy of the $Si_{1-x}Ge_x$ ($0 \leq x \leq 1$), the energy difference being the exciton binding energy. Thus, the laser's 5 output wavelength may be tunable from 1.2 to 2.0 micrometers by the choice of composition x. Because the optical gain of crystal silicon when injected with electrons and holes is less than the free carrier absorption (See M. J. Chen and C. S. Tsai, "*Model calculation on optical gain and co-stimulated emission of photons and phonons in silicon*," paper P2, Second IEEE International Conference on Group IV Photonics, Antwerp, Belgium, 21 Sep. 2005, the subject matter of which is hereby incorporated by reference), it is desirable to find ways to enhance the gain to overcome this self absorption.

Accordingly, the gain of the laser 5 may be enhanced in three ways: (1) adopting the resonator 16 to include a high-Q micro-ring rib-waveguide with very small volume, such as 3 to 5-nm in diameter and approximately 100 nm in height, which may be employed to increase the stimulated emission rate, via the Purcell-effect Q/V enhancement, (2) adapting the resonator 16 to include a lateral superlattice consisting of a hexagonal close packed array of 60-nm-diameter holes or pores (which is much smaller than the diameter in a photonic crystal lattice). This embodiment of the resonator may be fabricated in a thin layer, about 100 nm thick, of active semiconductor material in order to attain a large surface-to-volume ratio in the anti-dot lattice; thereby enhancing the concentration of excitons bound to the surface for promoting lasing since the laser transition is the radiative decay of these excitons. (3) The wings or platform of the rib waveguide may be made as nano-structures with the same periodic array of pores as the ring so that the P and N doped regions on the ring will give nano-structured electrical injection of electrons and holes into the ring from the lateral PIN diode, which will localize the electron and hole current paths on a nanoscale, thereby spreading the exciton wavefunctions in k-space and for enhancing the radiative emission rate by making the laser emission process mostly direct in k-space, at zone center.

Using double SOI, SGOI, GeOI, (silicon on insulator, silicon-germanium on insulator, germanium on insulator) the electrically pumped semiconductor micro-ring laser 5 of the present invention may employ vertical 3D integration as follows: (1) laser output via weak coupling of the laser cavity through a 100-nm-thick $SiO_2$ layer to a continuous, straight bus-channel waveguide, which preserves the high Q and also gives a uniform-gap coupling of bus to ring, (2) annual and disk P and N electrodes surround the ring over 360 degrees for radially uniform e-h injection, (3) vertical contact to the P and N regions is made by means of metal-filled openings or vias 100 to 200 nm in diameter in an $SiO_2$ capping layer on top of the ring, (4) metal contact pads with micrometer dimensions are deposited on top of the capping layer, (5) vertical optoelectronic integration with SOI CMOS is created with a third SOI region if desired.

The electrically pumped semiconductor micro-ring laser 5 of the present invention uses three techniques to enhance the optical gain of bulk crystal Si or SiGe because the simulation results (see M. J. Chen and C. S. Tsai, "*Model calculation on optical gain and co-stimulated emission of photons and phonons in silicon*," paper P2, Second IEEE International Conference on Group IV Photonics, Antwerp, Belgium, 21 Sep. 2005, the subject matter of which is hereby incorporated by reference in its entirety) show that the gain will always be less than the free-electron and free-hole absorption coefficients of the active layer when the layer is strongly injected with electron-hole pairs. The gain enhancers are: (1) the large Q/V Purcell factor of the ultracompact resonator, (2) the 60-nm-diameter pores 20 (FIG. 1) of the superlattice 18 (FIG. 1), together with a semiconductor layer height of 50 to 200 nm, produce a large surface-to-volume ratio with a high concentration of excitons or zone-center defect states to form and be bound at the surfaces, (3) the nano-structured P and N regions which constrict the injected current into narrow channels that nano-localize the electron-hole pairs, thereby enhancing the radiative recombination rate. The lasing transition is between the exciton or defect level (just below the conduction band edge) and the top of the valence band.

Figure 4:
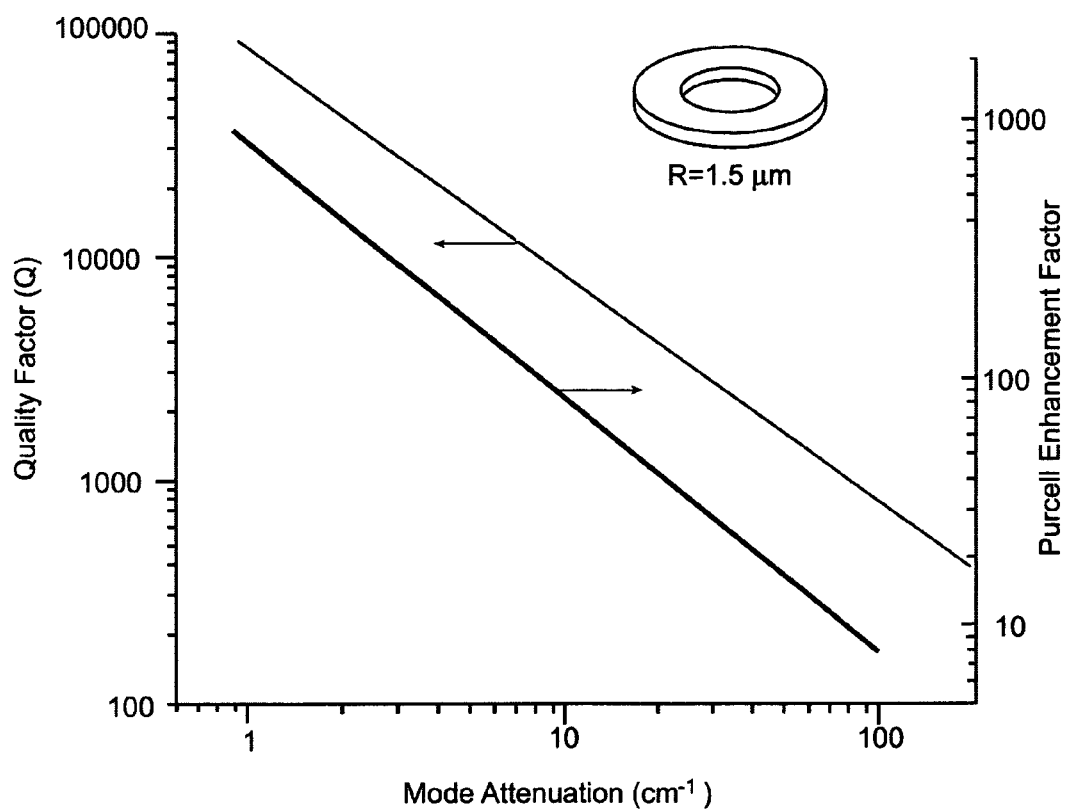
FIG. 4 shows a graph representing a Purcell enhancement factor and Q of a crystal silicon micro-ring resonator with a 3000-nm-diameter at $\lambda=1.28$ µm as a function of the mode attenuation factor $\alpha$ in $cm^{-1}$.

FIG. 4 illustrates a graph representing a calculation of the Purcell enhancement factor and Q of an ideal crystal-silicon nano-ring resonator with 3000-nm-diameter at $\lambda=1.28$ μm as a function of the mode attenuation factor $\alpha$ in cm$^{-1}$, a factor that is mostly related to 1/R, where R is the bend radius. In FIG. 4, the rib-waveguide ridge-width is 400 nm, the rib height is 100 nm, and the effective index is 3.52. A relatively strong spectral overlap between the gain profile and the resonator line width may be assumed. The $\alpha$ factor is the sum of several attenuation effects: the free-carrier absorption due to the ~$10^{17}$ cm$^{-3}$ deliberate doping of the ring ($\alpha_d$~1 cm$^{-1}$), the absorption due to e-h injection, the optical scattering loss due to ridge-wall roughness, and the radiative loss due to the ring's small bend-radius. The prediction of FIG. 4 shows high and practical gain enhancement even for relatively large $\alpha$ values.

The self-assembled superlattice formed in silicon has been experimentally demonstrated by Liang et al ("*Nonlithographic fabrication of lateral superlattices for nanometric electromagnetic-optic applications*," IEEE J. of Selected Topics in Quantum Electronics, vol. 8, pp 998-1008, September/October 2002, the subject matter of which is hereby incorporated by reference) who used a highly ordered anodized aluminum-oxide porous membrane as a base template on the silicon. A similar fabrication procedure may be employed to provide the photonic crystal lattice 18 incorporated on the laser 5 of the present invention.

In S. G. Cloutier and J. M. Xu ("*Laser-like emission from a periodic all-silicon nanometric superlattice*," submitted for publication 2005; see also S. G. Cloutier and J. M. Xu: "Indirect-bandgap Semiconductor Laser and Method to Fabricate Same," Harrington & Smith, PCT/US2004/017225 International Patent Application, 2004, the subject matter of which is hereby incorporated by reference) optically pumped laser action in a superlattice silicon was proven at cryogenic temperatures. The observed 1278 nm narrow-line luminescence is believed to persist at room temperature, albeit at lower intensity, for the laser of present invention since kT of 26 meV at 300K is less than the exciton binding energy.

The laser 5 of the present invention is based upon a multiple, vertically stacked silicon-on-insulator (or SiGeOI or GeOI) approach. Vertically stacked waveguiding has been experimentally demonstrated in double SIMOX SOI (R. A. Soref, F. Namavar and E. Cortesi, "*Vertically Integrated Silicon-on-Insulator Waveguides*", IEEE Photonics Technology Letters, Vol. 3, January 1991). FIG. 14 of U.S. Pat. No. 4,789,642 by J. P. Lorenzo and R. A. Soref, "Method for Fabricating Low Loss Crystalline Silicon Waveguides by Dielectric Implantation," 6 Dec. 1988, the subject matter of which is hereby incorporated by reference), which shows how an active silicon waveguide can cross over each other vertically in a double SOI. There are several ways to fabricate SiGeOI and GeOI and recent literature describes some of the most practical methods: (See Z. Chen, F. Zhang, J. Chen, B. Jin, Y. Wang, C. Zhag, Z. Zhang and X. Wang, "*Relaxed silicon-germanium-on-insulator fabricated by oxygen implantation and oxidation-enhanced annealing*," Semiconductor Science and Technology, UK, vol. 20 pp 770-774 (2005); see also S. J. Koester, G. Dehlinger, J. D. Schaub, J. O. Chu, Q. C. Ouyang, and A. Grill, "Germanium-on-insulator photodetectors," paper FBI, Second IEEE International Conference on Group IV Photonics, Antwerp, 21 Sep. 2005, the subject matter of which is hereby incorporated by reference).

In addition, if dense nanocrystalline Si (or nc-Si$_{1-x}$Ge$_x$) is employed rather than the crystalline form, then the required double-SOI can be built up in a straightforward way by deposition of the nc-film upon oxide-covered Si, followed by silicon dioxide "growth", followed by another nc-deposition and an oxide capping layer. The waveguide losses of nc-Si are not much larger than those of c-Si and thus may be suitable for high-Q resonator 16 (FIG. 1), as set forth in the laser 5 of the present invention.

A detailed fabrication procedure for 3D vertical integration in SIMOX SOI is presented in the papers of the Jalali group at UCLA (B. Jalali, P. Koonath, and T. Indukuri, "*Fabrication of vertically-coupled silicon nanophotonic circuits via SIMOX 3-D sculpting*," SPIE Photonics West, Optoelectronic Integrated Circuits IV, Vol. 5729-18/6, San Jose, Calif., January 2005; P. Koonath, T. Indukuri, and B. Jalali, "*Add-drop filters utilizing vertically-coupled microdisk resonators in silicon*," Applied Physics Letters, Vol. 86, Article 091102, March 2005, the subject matter of which is hereby incorporated by reference). In an embodiment, the fabrication procedure of the Jalali group at UCLA, as described above, may be employed for fabricating the electrically pumped semiconductor micro-ring laser 5 of the present invention. The bus waveguide (or network of bus waveguides associated with an array of lasers) is fashioned first by photolithography. Later, the laser, or array of lasers is "sculpted" in accordance with the Jalali method, for example, with photomasks for etching that are aligned to the bus waveguides below. The weak optical coupling between the bus waveguide 10 (FIG. 1) and an appropriate segment of the resonator 16 (FIG. 1) is obtained by evanescent waves that go through a uniform SiO$_2$ gap located between the bus waveguide 10 and resonator 16 (e.g., optical coupling layer 14), which is typically 80 to 200 nm thick.

The lateral PIN electrode geometry for injecting large concentrations of electrons and holes into a micro-ring resonator has already been proven experimentally for rings whose diameter are 10 micrometers or more (Q. Xu, B. Schmidt, S. Pradham and M. Lipson, "*Micrometer-scale silicon electro-optic modulator*," Nature, vol. 453, no. 19, pp 325-327, 19 May 2005, see also L. Zhou and A. W. Poon, "Silicon-on-insulator electro-optically tunable waveguide-coupled microdisk resonators with selectively integrated p-i-n diodes," paper WC5, Second IEEE International Conference on Group IV Photonics, Antwerp, Belgium, 21 Sep. 2005, the subject matter of which is hereby incorporated by reference) although the electrodes did not encompass the entire circumference as they do beneficially in the laser 5 of the present invention.

The PIN diode defined in the laser 5 of the present invention is forward-biased to allow e-h carrier densities as high as the P and N impurity concentrations to be injected into the ridge; namely $10^{19}$ pairs per cm$^3$ for a ridge background doping of $10^{17}$ cm$^{-3}$ (the so-called intrinsic carrier concentration) The background cannot be much more than $10^{17}$ cm$^{-3}$ in order to avoid ring mode loss from free carrier absorption. The fringing E-fields from the slab electrodes overlap well with the guided-mode's optical field in the ridge-plus-slab. Although the TE-like fundamental mode offers better waveguide confinement than the fundamental TM-like mode, the TM mode is proposed here for the laser because of empirical evidence from J. Xu that the TM-polarized light emission from the lateral superlattice is stronger than that of TE. The waveguide losses for TM are expected to be somewhat larger than those for TE. The etching depth of the rib is chosen to be around 70% as in the Q. Xu reference. The single-mode condition for such ribs is discussed in G. T. Reed et al, "*Design considerations for devices based upon small SOI waveguides,*" paper FC5, Second IEEE International Conference on Group IV Photonics, Antwerp, Belgium, 21 Sep. 2005, the subject matter of which is hereby incorporated by reference). The presence of a cylindrical-hole-filled superlattice within the rib will lead to scattering loss in the near infrared; however, because the pore diameter is less than 5% of the infrared wavelength, the SL-induced loss will be relatively small.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. An electrically pumped semiconductor laser, comprising:
   a silicon substrate;
   a strip waveguide structure disposed on the substrate;
   an optical coupling layer disposed on the substrate and the strip waveguide structure;
   a resonator layer disposed on the optical coupling layer and including a lateral superlattice having a plurality of substantially cylindrical pores extending downwardly into the resonator layer;
   an insulating cap layer disposed on the resonator layer and being operative to seal the superlattice;
   a first plug-filled via formed on a central region of the cap layer and extending downwardly to permit a bottom portion of the first plug to communicate with a first impurity-doped unguided wing region of the superlattice; and
   a second plug filled via formed on an edge region of the cap layer and extending downwardly to permit a bottom portion of the second plug to communicate with a second impurity-doped unguided wing region of the superlattice, wherein electrical current conducted between the first and second plug-filled vias is operative to excite predetermined elements of the superlattice defined on the resonator layer for generating light in the resonator layer which is redirected to the waveguide structure, via the optical coupling layer.

2. The semiconductor laser of claim 1, wherein the substrate includes a silicon-on-insulator structure providing crystal silicon for the bus.

3. The semiconductor laser of claim 1, wherein the resonator includes a rib-waveguided intrinsic micro-ring resonator.

4. The semiconductor laser of claim 3, wherein the rib-waveguided intrinsic micro-ring resonator includes crystal silicon.

5. The semiconductor laser of claim 3, wherein the rib-waveguided intrinsic micro-ring resonator includes dense nanocrystalline silicon.

6. The semiconductor laser of claim 3, wherein the rib-waveguided intrinsic micro-ring resonator includes crystal silicon-germanium alloy.

7. The semiconductor laser of claim 3, wherein the rib-waveguided intrinsic micro-ring resonator includes crystal germanium.

8. The semiconductor laser of claim 3, wherein the rib-waveguided intrinsic micro-ring resonator includes dense nano-crystalline silicon-germanium alloy.

9. The semiconductor laser of claim 1, wherein the bus waveguide structure is constructed and arranged to channel light received from the resonator to an optical output.

10. The semiconductor laser of claim 9, wherein the waveguide structure includes an elongated structure having a substantially transparent top surface facing the optical coupling layer and remaining surfaces adapted to retain and redirect light towards the optical output.

11. The semiconductor laser of claim 1, wherein the optical coupling layer includes an optically transparent material having predetermined thickness that correlates to a predetermined wavelength of light realized in the waveguide.

12. The semiconductor laser of claim 1, wherein the wing portion formed along an edge region of the resonator layer is perforated by the same resonator superlattice.

13. The semiconductor laser of claim 12, wherein the ridge portion of the superlattice includes an unguided central p-type (or n-type) semiconductor material doped wing region disposed to be in substantial alignment with the bottom portion of the first plug.

14. The semiconductor laser of claim 13, wherein the superlattice further includes an unguided wing portion formed on a edge region of the resonator layer.

15. The semiconductor laser of claim 14, wherein the edge region of the superlattice includes an unguided n-type (or p-type) semiconductor material doped wing region, surrounding the resonator, disposed to be in substantial alignment with the bottom portion of the second plug.

16. The semiconductor laser of claim 15, wherein the pores located on the wing region of the superlattice penetrate the wing and have a shallower depth with respect to the pores located on the ridge region of the photonic crystal lattice.

17. The semiconductor laser of claim 1, wherein each of the pores include a diameter ranging from approximately 50 nm to approximately 100 nm.

18. The semiconductor laser of claim 1, wherein the resonator layer includes a diameter ranging from approximately 3000 nm to approximately 5000 nm for providing a relatively large Purcell Q/V effect.

19. The semiconductor laser of claim 1, wherein the cap layer includes silicon dioxide.

20. The semiconductor laser of claim 1, wherein the first and second plug filled vias include a diameter ranging from approximately 100 nm to approximately 200 nm.

21. The semiconductor laser of claim 1, further including first and second contact pads respectively disposed on top portions of the first and second plugs for providing electrical connection to a source.

22. The semiconductor laser of claim 1, wherein a predetermined composition for the resonator is selected to provide a lasing wavelength ranging from approximately 1200 nm to approximately 2000 nm.

* * * * *